United States Patent [19]

Smarandoiu et al.

[11] Patent Number: 5,390,147
[45] Date of Patent: Feb. 14, 1995

[54] CORE ORGANIZATION AND SENSE AMPLIFIER HAVING LUBRICATING CURRENT, ACTIVE CLAMPING AND BUFFERED SENSE NODE FOR SPEED ENHANCEMENT FOR NON-VOLATILE MEMORY

[75] Inventors: George Smarandoiu; Emil Lambrache, both of San Jose, Calif.

[73] Assignee: Atmel Corporation, San Jose, Calif.

[21] Appl. No.: 204,866

[22] Filed: Mar. 2, 1994

[51] Int. Cl.$^6$ .............................................. G11C 11/40
[52] U.S. Cl. ................................ 365/185; 365/189.05; 365/189.09; 365/189.11; 365/210; 365/204; 365/230.03
[58] Field of Search .................... 365/185, 210, 189.09, 365/189.11, 189.05, 204, 230.03

[56] References Cited

U.S. PATENT DOCUMENTS

| | | | |
|---|---|---|---|
| 4,799,195 | 1/1989 | Iwahashi et al. | 365/210 |
| 4,916,665 | 4/1990 | Atsumi et al. | 365/189.09 |
| 5,022,003 | 6/1991 | Kohno | 365/185 |
| 5,029,138 | 7/1991 | Iwashita | 365/210 |
| 5,040,148 | 8/1991 | Nakai et al. | 365/185 |
| 5,148,397 | 9/1992 | Kokubun | 365/189.09 |
| 5,197,028 | 3/1993 | Nakai | 365/210 |
| 5,198,997 | 3/1993 | Arakawa | 365/185 |
| 5,206,552 | 4/1993 | Iwashita | 365/189.11 |
| 5,237,534 | 8/1993 | Tanaka et al. | 365/185 |
| 5,293,345 | 3/1994 | Iwahashi | 365/189.09 |

*Primary Examiner*—Joseph E. Clawson, Jr.
*Attorney, Agent, or Firm*—Schneck & McHugh

[57] ABSTRACT

Sense amplifier performance is improved in a sense amplifier circuit connected to a semiconductor memory. A current mirror circuit is connected to a data node on the side of a pass transistor adjacent to core memory. The other side of the current mirror circuit is connected to modify the current provided from a memory reference cell. This provides a lubricating current to the pass transistor to ensure that it does not shut down in the absence of current flow from a core memory cell. Sense amplifier speed is improved by a higher transconductance level in the pass transistors. Speed is improved by reducing sense node capacitance through buffer circuitry. Core performance is enhanced by interspersed reference columns within the core at distributed locations.

13 Claims, 3 Drawing Sheets

CORE ORGANIZATION AND SENSE AMPLIFIER HAVING LUBRICATING CURRENT, ACTIVE CLAMPING AND BUFFERED SENSE NODE FOR SPEED ENHANCEMENT FOR NON-VOLATILE MEMORY

TECHNICAL FIELD

The invention relates to semiconductor memory arrangements and methods, and more particularly to semi-conductor sense amplifier circuit arrangements and methods.

BACKGROUND ART

Sense amplifiers are circuits used in reading data from storage transistors, i.e. core memory, in semiconductor memory arrays. One example of a known sense amplifier arrangement is shown in U.S. Pat. No. 5,198,997, to H. Arakawa, entitled "Ultraviolet Erasable Nonvolatile Memory". The arrangement shown in this patent is of particular interest in that it is directed toward a sense amplifier arrangement which includes a reference cell which is connected to the core memory sensing circuitry in another column through a current mirror arrangement.

FIG. 3 shows another sense amplifier arrangement according to the prior art, which differs from Arakawa. In particular, FIG. 3 shows a sense amplifier circuit 300 effective for detecting the conductive state of selected memory cells in the core memory of a selected semiconductor memory chip. The particular sense amplifier circuit 300 shown is a generally known approach applicable in particular to the field of variable threshold memory devices. The field of such devices includes the subfields of EPROMs, i.e., electrically programmable and ultra-violet (UV) erasable read only memories and EEPROMs, i.e., electrically programmable and electrically erasable read-only memories.

For purposes herein, and by convention, the conductive state of a memory cell containing a variable threshold device is defined as "low", if the cell is conductive or "on", and as "high", if the cell is non-conductive or "off".

The information regarding the conductive state of a particular core cell 310 in chip memory is transmitted by currents passing along a bit line 320 which is connected through several additional devices to a sense node 340 connected to the input side of one or more inverters 350, which amplify the voltages produced at sense node 340, in order to suitably drive an output device, not shown.

As is well known, core cell 310 may comprise one or more transistors; for example, core cell 310 may comprise a select transistor 311 connected at its drain to a bit line 320 and at its source to the drain of a variable threshold transistor 312 and driven at its gate by a word line 313, and a variable threshold transistor 312 driven at its gate by a sense line 314. A particular core cell is selected in read mode by applying appropriate bias voltages to word line 313 and sense line 314 and by turning on one or more core select transistors, such as core select transistor 321. Such a combination of bias conditions will effectively connect core cell 310 to a data bus 330, which acts as the core side input to sense amplifier 300. In addition, sense amplifier 300 has a reference side input line 430 which is additionally connected to a reference cell 410 similar to core cell 310. Reference cell 410 is driven at the gate of reference cell select transistor 411 by a reference cell select line 413, and at the gate of a reference cell variable threshold transistor 412 by a reference sense line 414.

The core side input of the sense amplifier, i.e., data bus 330, acts as inverting input to differential amplifier 333 and is also connected to the source of first pass transistor 331. The drain of first pass transistor 331 is connected to sense node 340, which in turn is connected to the source of second pass transistor 342, to the drain of current mirror transistor 341, to the input of amplifying inverter 350 and to the drain and gate of a clamping transistor 360.

The reference side input of the sense amplifier, i.e., reference data node 430, is connected to the source of third pass transistor 431. The drain of third pass transistor 431 is connected to reference node 440, which also connects to the gate and drain of a current mirror transistor 441, as well as to the gate of a current mirror transistor 341.

In addition, the non-inverting input of differential amplifier 333 is connected to a bias voltage source VB at node 332, the gate of first pass transistor 331 is connected to the output 334 of differential amplifier 333 and the gate of second pass transistor 342 is connected to the positive side 335 of bias voltage source VD, which in turn is connected at its negative side to output 334 of differential amplifier 333. In addition, clamping transistor 360 is connected at its source 370 to clamping voltage source VC.

In a practical implementation of this sense amplifier arrangement, the differential amplifier 333 and the various voltage supplies, VB, VD, and VC, would actually be implemented with a combination of transistors; they are shown here as ideal components for the purpose of explaining the operation of the sense amplifier.

Differential amplifier 333, in conjunction with bias voltage source VB, forces the voltage potential on data bus 330 to a controlled level effective for biasing the bit line connected terminal of the core cell. This bias approximately equals VB, with a typical value of ca. 2 V. The function of the first and second pass transistors 331 and 342 is to provide a current path for maintaining a voltage potential on data bus 330 equal to VB. If data bus 330 were discharged in the process of inquiring as to the status of a particular core cell, then the combination of first and second pass transistors 331 and 342 would provide a current path for restoring the voltage potential on data bus 330 approximately to VB. Voltage source VD provides an adequate drain-to-gate bias to keep first pass transistor 331 saturated under steady state bias conditions, i.e., when data bus 330 is charged up to a level essentially equal to VB. Thus, first pass transistor 331 will be maintained in an operational region in which the current is quadratically dependent on the gate-to-source bias, a condition favorable for operational faster response times by the circuit.

The function of third pass transistor 431 is to limit the voltage potential on reference data node 430 to a value essentially equal to the voltage potential on the data bus 330. This arrangement provides essentially similar drain bias conditions to both the selected core cell 310 as well as to reference cell 410. When applying appropriate bias voltages to reference cell select line 413 and to reference sense line 414, a current $I_{REF}$ flows through the reference cell. This reference current is mirrored via the two current mirror connected transistors 441 and 341 and is reflected at sense node 340 as the current $I_{SENSE}$.

The various device sizes and bias levels are typically chosen in such a manner as to obtain a current $I_{SENSE}$ essentially equal to about one half of $I_{CORE}$, where $I_{CORE}$ corresponds to the current of a "low" state core cell; thus, when reading the contents of a conductive cell, the sum of currents at sense node 340 would be such as to keep first and second pass transistors 331 and 342 in a conductive state and the voltage potential relatively low, while when reading a nonconductive cell, the sum of currents at sense node 340 will be such as to charge up the sense node to a higher voltage potential than that corresponding to the previously described conductive core cell case. The voltage potential at sense node 340 is limited at the lower end to a value close to VB+VD, as explained earlier, and the upper value is limited by the combination of clamping transistor 360 and clamping voltage source VC connected to the source of clamping transistor 360 at node 370. Reduced voltage swing at sense node 340 is desirable since it translates into reduced charge transfer and thus faster response time. Additionally, the trip point of inverter 350 should be above the lowest sense node potential, i.e., VB+VD, and below the highest sense node potential, as determined by clamping transistor 360 and clamping voltage source VC.

The arrangement described above senses the conductive state of the core cells. However, its performance is limited by several factors. By employing an individual, typically UV erased, reference cell associated with a sense amplifier in conjunction with a multitude of core cells programmed under varying voltage and temperature conditions, it is difficult to obtain optimum matching between the current of the reference cell, $I_{REF}$, and the current of the core cell, $I_{CORE}$, over a wide temperature and voltage range.

Further, when switching from reading a "high" state to reading a "low" state, data bus 330 starts out from being fully charged and has to be discharged just enough so that first pass transistor 331 will conduct a current somewhat larger than $I_{SENSE}$, thus starting a downward movement of sense node 340. The voltage change required to turn on first pass transistor 331 is brought about by the fact that the conductive core cell must discharge the initially fully charged data bus 330. This is typically the limiting factor in response time, since the relatively small cell current "fights" the relatively large capacitive load of the data bus.

Additionally, while the clamping transistor 360 is meant to limit the voltage swing at sense node 340, it also adds capacitive loading which counteracts the benefit of reduced voltage swing.

Furthermore, since inverter 350 operates in a high gain region, it will present a relatively large capacitive load to sense node 340, due to inherent gate capacitance, as well as Miller reflected capacitance.

An object of the invention herein is accordingly to increase the speed of reading core memory by improving on or eliminating the limiting factors indicated above.

SUMMARY OF THE INVENTION

The above object has been achieved by replacing the individual reference cell with a "column" of reference cells, which are programmed simultaneously with the core cells sharing the same "word line". In the sense amplifier, the first pass transistor separating the data bus from the sense node is maintained in a conductive state, irrespective of core cell current. The sense node clamping diode is eliminated and replaced with an "active" clamping arrangement, and the sense node is buffered from the first inverting stage through a low input capacitance and relatively high output drive buffer stage.

By employing a "column" of reference cells which share the same word lines and, as the case may be, sense lines with the core cells, one can achieve very good matching of reference cell current and core cell current, because the core and reference cell sharing the same word line will be programmed at the same time under similar temperature and voltage conditions. Furthermore, by physically placing the reference cells dispersed within the core, one achieves very good dimensional matching of reference to core cells. Thus, the current of a conductive memory cell will be essentially equal to the current of the reference cell.

The pass transistor separating the sense node from the data bus is "lubricated" by maintaining it in a conductive state irrespective of the conductive state of the core cell being sensed. Thus, the current flowing through the pass transistor will change from a finite value, $I_{LUB}$, to a value equal to $I_{LUB}+I_{CORE}$, instead of changing from zero (non-conductive cell) to $I_{CORE}$ (conductive core cell). The gate-to-source voltage change required to bring about this current change is smaller than in the case of the "non-lubricated" pass transistor due to the quadratic relationship between transistor current and gate to source voltage. Thus, the voltage swing required on the data bus to bring about a change from sensing a non-conductive cell to sensing a conductive cell is reduced, and the response time is improved. In order to maintain the desired relationship between core cell current and reference cell current, the "lubrication" current is mirrored to cancel out at the sense node. Speed of the circuit operation is improved by reducing sense node capacitance through the buffer circuitry employed.

BEST MODE FOR CARRYING OUT THE INVENTION

Figure 1:
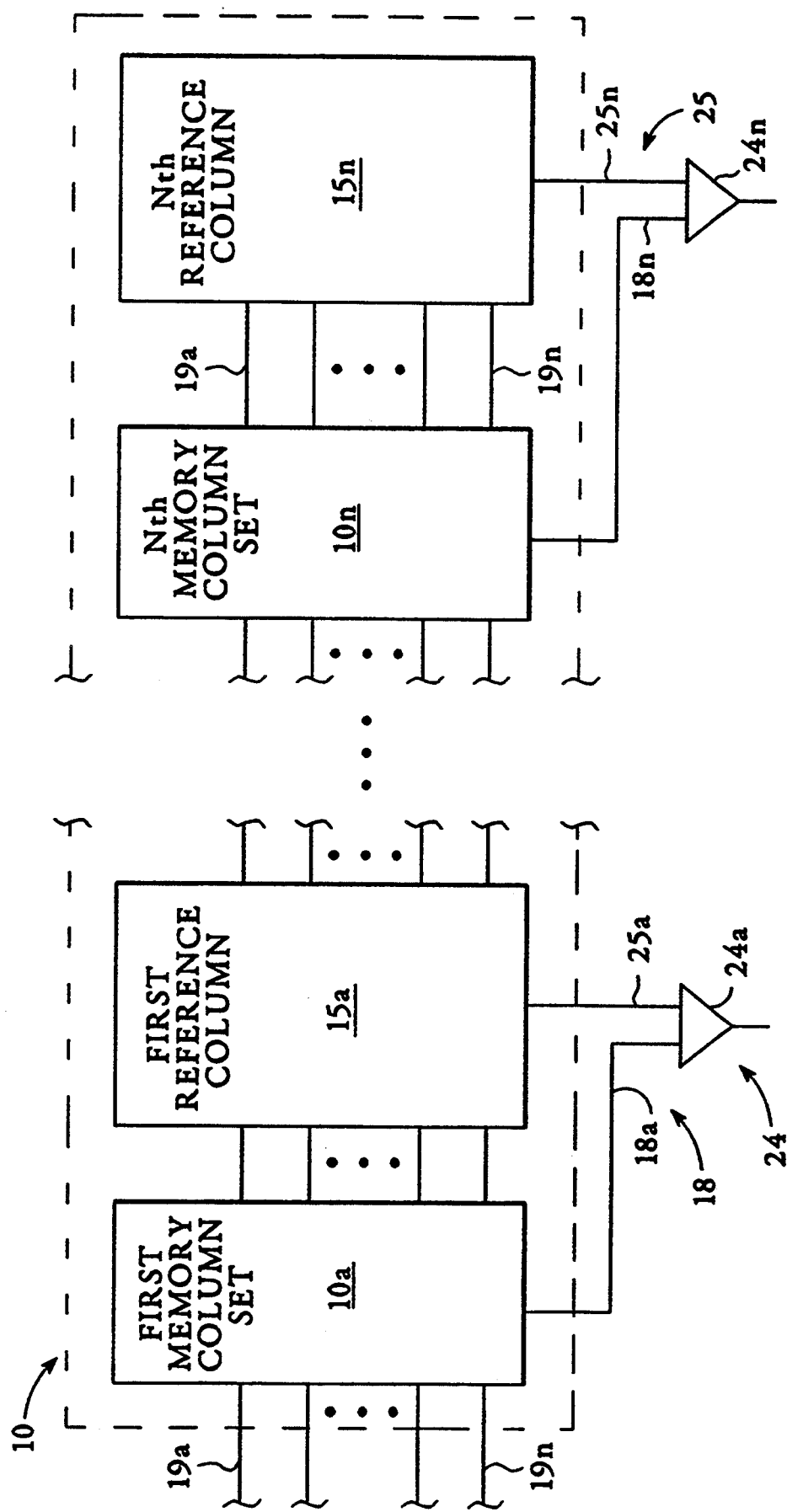
FIG. 1 is a memory plan view illustrating the improved core arrangement in accordance with the invention herein, which includes interspersed reference columns distributed within the core.

FIG. 1 shows a core arrangement according to the invention herein. In particular, there is shown memory core 10 including, according to one embodiment, 2048 active (and additionally 32 redundant) memory core columns each associated with a predetermined number of core cells including a select transistor and a floating gate transistor, as noted above. The memory core 10 is organized according to the invention into a plurality of core memory column sets, 10a through 10n, and reference columns 15a through 15n. According to one version, each memory column set, 10a...10n, includes 128 active (and additionally two redundant) memory core columns which are selectively connectable to one of data nodes 18 which in turn serve as an input point to one of sense amplifier circuits 24. In total, there are "n" data nodes, 18a . . . 18n. Additionally, each of sense amplifier circuits 24 has connected at its input an associated reference column node 25a . . . 25n connected to a respective one of reference columns 15a . . . 15n. Accordingly, as to sense amplifier circuit 24a, there is provided a corresponding pair of input nodes, respectively 18a and 25a, which are the data node and the reference column node inputs in that order. It is accordingly apparent that memory core 10 includes a plurality of column sets 10a . . . 10n each associated with a corresponding reference column 15a . . . 15n having a reference column node 25a . . . 25n. The reference columns are interspersed between the column sets 10a . . . 10n and are distributed within memory core 10. A result of this interspersed distribution within memory core 10, is the establishment of automatic matching of core cell parameters and reference cell parameters over the entire effective voltage and temperature range. Each row of memory and reference core cells is programmed at a particular voltage and temperature. Accordingly, the reference cell of the applicable reference column is automatically programmed to match the conditions of the corresponding memory core cell at the particular row within memory core 10. Memory column sets 10a . . . 10n and reference columns 15a . . . 15n are interconnected by word lines 19a . . . 19n.

Figure 2:
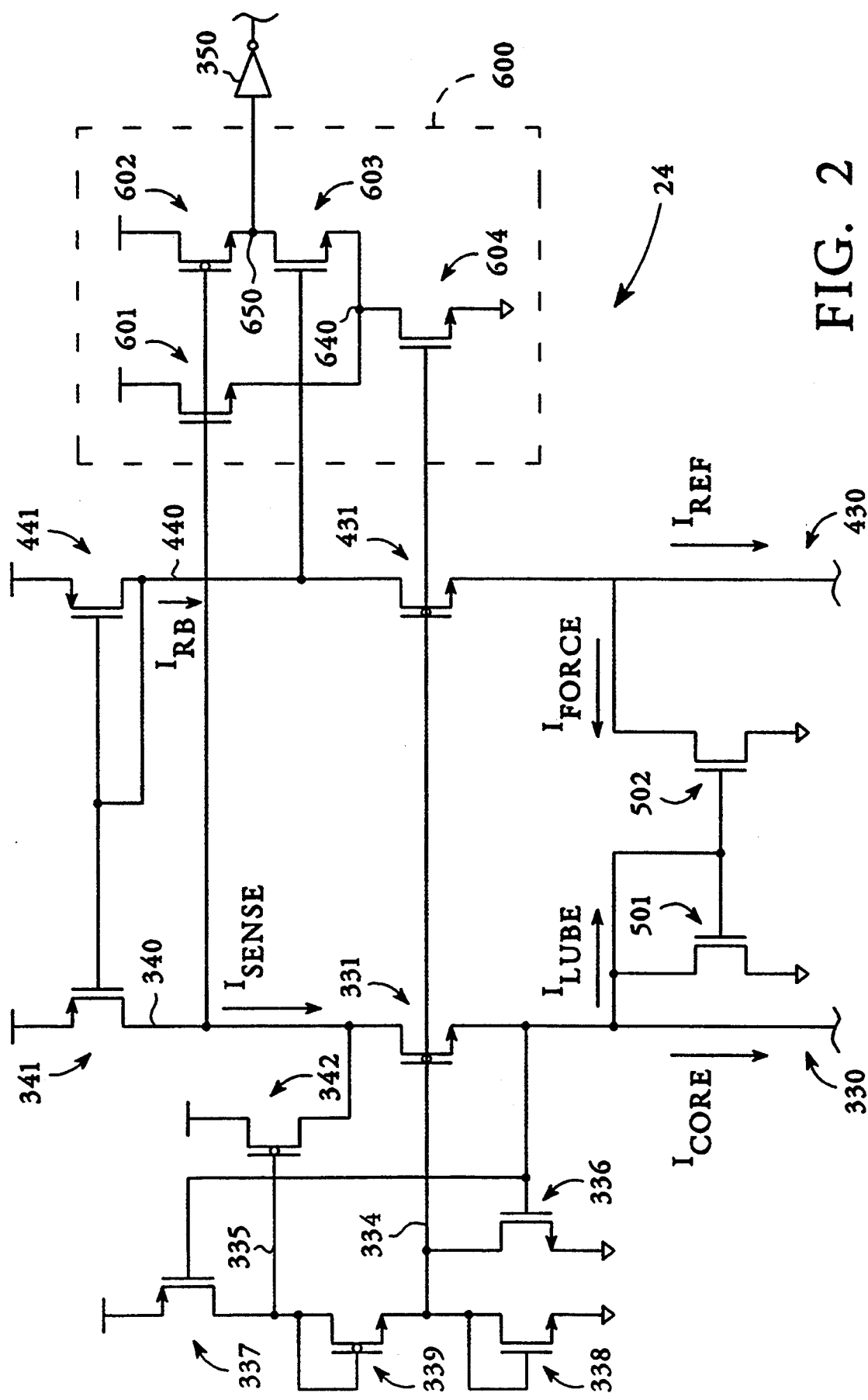
FIG. 2 shows a circuit arrangement according to the invention which is effective for improving sense amplifier performance by "lubricating" the pass transistor connecting the data bus to the sense node and by buffering the sense node from the first inverter through the use of a low input capacitance/high output drive stage.

FIG. 2 shows a sense amplifier circuit 4 according to the invention which includes a "lubrication" stage 30 having transistors 501 and 502 and a low input capacitance buffer stage 600 including an arrangement of transistors 601, 602, 603 and 604, explained in greater detail below. Further shown in FIG. 2 are respective transistors 336, 337, 338 and 339 which form a network effective to maintain an essentially stable bias voltage at the inputs to the sense amplifier, i.e., data input node 330 and reference input node 430. The gates of transistors 336 and 337 are connected to the data input node 330, which in turn connects to the source of first pass transistor 331 and to the drain and source of "diode" connected "lubrication" transistor 501. The source of transistor 336 is connected to the ground terminal, and the source of transistor 337 is connected to the positive supply terminal. The drain of transistor 337 is connected to the second bias node 335, which is also connected to the gate of second pass transistor 342 and to the drain and gate of transistor 339. The source of transistor 339 is connected to first bias node 334, which also connects to the drain of transistor 336, the drain and gate of transistor 338, the gate of first pass transistor 331 and the gate of third pass transistor 431. The source of transistor 338 is connected to the ground terminal. Transistors 336, 337, 338 and 339 constitute a modified inverter which has an input at data input node 330 and two outputs at first bias node 334 and second bias node 335. If first pass transistor 331 is relatively large in relation to the currents flowing through it, and if it is a "0" threshold transistor then at a steady state, the voltage level of first bias node 334 will be just slightly higher than the voltage level on data input node 330. The voltage level at second bias node 335 will be still higher than the voltage level at first bias node 334 due to the voltage drop across transistor 339 as a result of the currents flowing through it. The voltage level on the drain of first pass transistor 331 will be close to the voltage level at second bias node 335, if second pass transistor 342 is built using a "0" threshold transistor and is large enough in relation to the currents flowing through it. Therefore, the voltage on the drain of first pass transistor 331 is higher than the voltage on the gate of that transistor, and the transistor is kept saturated, a condition desirable for higher transconductance.

At steady state, both data input node 330 and reference input node 430 will be at stable levels corresponding to the sensing of either a conductive or nonconductive core cell. The variable threshold core cell, as well as variable threshold reference cell, are connected to the two sense amplifiers inputs 330 and 430, as shown in FIG. 1.

When sensing a "low" state, i.e., conductive cell, a current $I_{CORE}$ will flow from the data input 330 towards the selected core cell, and a current $I_{REF}$ will flow from reference node 430 to the selected reference cell. In the case of the core cell/reference cell arrangement shown in FIG. 1, where all the core cells within one memory output share a reference cell driven by the same word and/or sense line and also similar in size to the active core cell, $I_{CORE}$ will be substantially equal to $I_{REF}$.

The combination of devices formed by first pass transistor 331, second pass transistor 342, and modified inverter transistors 336, 337, 338 and 339 will force a voltage level onto data input node 330, which has a value close to the trip point of the modified inverter, where the trip point is defined as the voltage applied at the data input node 330 that results in an equal voltage level at the first bias node 334. The voltage "forced" onto the data input node will determine a current $I_{LUBE}$ to flow through "lubrication diode" connected transistor 501. A "mirror" image of current $I_{LUBE}$ will flow through transistor 502 which has the gate connected to data input node 330, the drain connected to the reference input node 430 and the source connected to the ground terminal. The magnitude of $I_{FORCE}$, the mirrored current flowing through transistor 502, will depend on the ratio between the physical sizes of transistors 501 and 502. The size ratio between "lubrication" transistors 502 and 501 is preferably the same as that between the "top" current mirror transistors 441 and 341, so as to result in a cancellation of "lubrication" current at sense node 340.

In a preferred embodiment of the sense amplifier, the size ratio between transistors 502 and 501 and 441 and 341 is approximately 2 to 1, i.e., at a similar voltage bias, the larger transistor will conduct twice the current of the smaller transistor. Thus, the current flowing through the reference branch, i.e., through top mirror transistor 441 and third pass transistor 431 is:

$$I_{RB} = I_{FORCE} + I_{REF} = 2 \times I_{LUBE} + I_{CORE}$$

and the current flowing through top mirror transistor 341 tends toward $I_{SENSE} = I_{RB}/2 = I_{LUBE} + I_{CORE}/2$.

Therefore, in the presence of a conductive memory cell, when $I_{CORE}$ is flowing out of data input node 330 into the active core, the current flowing out of the source of first pass transistor 331 is:

$$I_{TOT} = I_{CORE} + I_{LUBE}$$

Since $I_{SENSE} = I_{CORE}/2 + I_{LUBE}$, second pass transistor 342 will be on and will deliver a current equal to $I_{CORE}/2$ in order to maintain current balance at sense node 340. If second pass transistor 342 is on, then the voltage level at sense node 340 is relatively "low".

Conversely, if a non-conductive core cell is being read, and the current flowing from the data input node 330 towards the core is 0, then the current flowing out of the source of first pass transistor 331 is:

$$I_{TOT} = 0 + I_{LUBE} = I_{LUBE}$$

Figure 3:
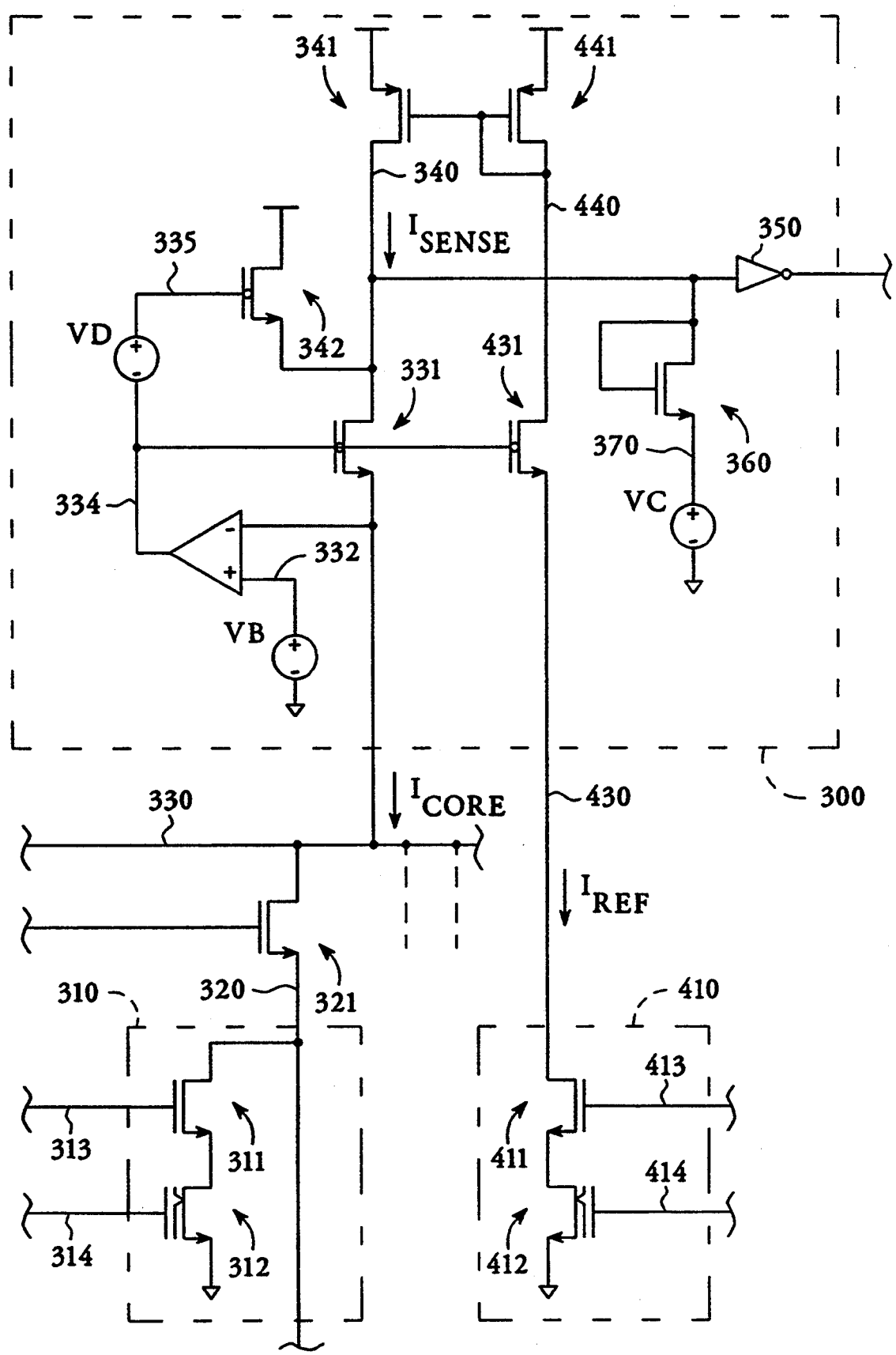
FIG. 3 shows a sense amplifier arrangement according to the prior art.

Since $I_{SENSE}$ tends toward being equal to $I_{CORE}/2 + I_{LUBE}$, and since $I_{SENSE}$ can not be larger than $I_{LUBE}$, it follows that the voltage level on sense node 340 will rise until the drain of transistor 341 is high enough so that a current equal to $I_{LUBE}$ will flow through transistor 341. This can only happen if transistor 341 enters into the linear region. As a result, sense node 340 is charged "up" to a relatively "high" level, but this level is below the positive supply voltage, i.e., current will still be flowing through transistor 341, thus actively clamping sense node 340 at a level below the positive voltage supply. This active clamping action limits the voltage swing at the sense node, thus improving speed, as compared to a "non-clamped" approach, without burdening the sense node with additional clamping devices as used in the prior art, seen in FIG. 3.

It follows that at steady state, the current flowing through first pass transistor 331 will vary from a low value equal to $I_{LUBE}$ to a high value equal to $I_{LUBE} + I_{CORE}$. The voltage level on the data input node 330 will also vary accordingly. This voltage will be somewhat lower when the current flowing through the first pass transistor 331 is higher. The voltage difference at data input node 330 between the "high" and respectively "low" state will be smaller in the presence of $I_{LUBE}$, thus resulting in faster switching time compared to the case where $I_{LUBE}$ would not be present. This is a result of the quadratic dependence of transistor current on gate to source voltage when the MOS transistor is saturated.

"Lubrication diode" connected transistor 501 also plays an important role in the transient behavior of the sense amplifier. Thus, when the sense amplifier is charging up a previously discharged data input node 330, due to the finite phase lag between the first bias node 334 and the data input node 330, it is possible for first pass transistor 331 to "overcharge" the data input node 330 to the point where first pass transistor 331 is actually shut off. If first pass transistor 331 shuts off during the data input node charge-up process and a conductive cell is being sensed, then the data input node 330 has to be discharged again until first pass transistor 331 turns on, thus permitting the data input node 330 to communicate with the sense node 340. In the presence of $I_{LUBE}$, an overcharged data input node 330 is discharged faster, thus again contributing to faster response time. The overcharging scenario also applies in the case of a sudden drop in supply voltage level, when the voltage at the first bias node 334 could drop, thus shutting off first pass transistor 331. In such a case, the presence of $I_{LUBE}$ speeds up recovery substantially. Diode connected transistor 338 is used to control the gain of the modified biasing inverter and to improve its response time.

In contrast to the prior art where the sense node 340 was connected directly to the input of inverter 350, in the present invention, the sense node is buffered from the first inverting stage. Specifically, sense node 340 is connected to the gate of "follower" connected transistor 601 and the gate of "0" threshold and "follower" connected transistor 602. The internal reference node 440 is connected to the gate of transistor 603, which acts as a current switch. The drain of transistor 603 is connected at node 650 to the input of inverter 350 and to the source of "follower" transistor 602. The source of transistor 603 is connected at "follower node" 640 to the source of "follower" transistor 601 and to the drain of "current source" connected transistor 604. The drains of transistors 601 and 602 are connected to the positive supply, and the source of transistor 604 is connected to the ground terminal. The gate of "current source" connected transistor 604 is connected to first bias node 334. Since the sense node 340 is driving "follower" type inputs, it follows that the "following" nodes 640 and 650 move "in phase" with the driving sense node, and therefore the capacitive loading presented to the sense node 340 is light compared to the case where the sense node directly drives an inverter input.

When a "low" state, i.e., conductive core cell, is detected, the voltage level at sense node 340 is below the voltage level at internal reference node 440. Therefore, the current flowing through "current source" connected transistor 604 is steered through transistor 603, rather than through transistor 601, and "follower" transistor 602 will be weak or "off". This allows inverter input node 650 to discharge to a low level which should be below the trip point of inverter 350. Conversely, when a "high" state is detected, then sense node 340 will be at a relatively high level, higher than the voltage level at the internal reference node 440. Consequently, the current flowing through "current source" connected transistor 604 will be steered through "follower" transistor 601, rather than through transistor 603. Also, "follower" transistor 602 will pull inverter input node 650 high without significant "opposition" from "current switch" transistor 603. The input to inverter 350 is thus clamped "high" below the highest level of the sense node 340 and clamped "low" at a bias approximately one enhancement threshold below the relatively stable level of the internal reference node 440. Whereas the current moving the sense node 340, when it is close to the quiescent state, is approximately $I_{CORE}/2$, the currents moving the input of inverter 350 can be much stronger, thus resulting in faster response time. Additional gain is provided by driving the current source transistor 604 from the bias node 334; thus, when detecting a "low" state, the bias node 334 will be relatively higher and a stronger current will be forced through transistor 604, thus discharging buffer output node 650 faster than a constant current would. Conversely, when detecting a "high" state, bias node 334 will be relatively lower and a weaker current will be forced through transistor 604, thus presenting less opposition to the upward movement of node 650.

In summary, according to the arrangement of the invention, sense time has been improved through the use of reference columns associated with groups of core columns, by maintaining relatively higher transconductance in the pass transistors, by actively clamping both the sense node as well as inverter input voltage swings and by reducing sense node capacitive loading through follower buffering circuitry.

It is claimed:

1. A sense amplifier circuit connected to a semiconductor memory, comprising:
   (a) data node means for receiving an electric current from a selected core memory cell indicative of its memory state;

(b) sense node means for receiving an electric current from said data node means reflecting an electric current received by said data node means;

(c) reference node means for receiving a reference current from a selected reference cell indicative of the state of said reference cell;

(d) a reference current mirror circuit including first and second reference transistors, each reference transistor having respective base, drain, and source nodes, each of the source nodes of said reference transistors being connected to a selected supply voltage, the gate nodes of said first and second reference transistors being electrically connected to each other, the drain node of said first reference transistor being connected to said sense node means and the drain node of said second reference transistor being connected to its gate node and being provided with an electric current from said reference node means reflecting electric currents received by said reference node means, said reference current mirror circuit being effective for providing said sense node means with an electric reference current in proportion to electric current provided from said reference node means to said second reference transistor;

(e) pass transistor means for limiting the voltage on said data node means, said pass transistor means having a source and a drain, said drain being connected to said sense node means, and said source being connected to said data node means; and (f) a lubrication current mirror circuit including first and second lubrication transistors, each of said lubrication transistors having respective gate, drain, and source nodes, each of the source nodes of said lubrication transistors being connected to a common node, the gate nodes of said first and second lubrication transistors being electrically connected to each other, the drain node of said first lubrication transistor being connected to said data node means and being provided with current from said data node means, the drain node of said first lubrication transistor being connected to its gate node and said data node means, said lubrication current mirror circuit being effective for providing said reference node means and said reference current mirror circuit with electric current in proportion to a lubrication current provided from said data node means to said first lubrication transistor, and said lubrication current mirror circuit being effective for providing a predetermined amount of electric current to said pass transistor means, whereby said pass transistor means remains open even in the absence of current flow from a core memory cell.

2. The sense amplifier circuit according to claim 1, wherein said first and second reference transistors and said first and second lubrication transistors are MOS transistors.

3. The sense amplifier circuit according to claim 2, wherein each of said first and second transistors are connected at a common node.

4. The sense amplifier circuit according to claim 2, wherein each of said first and second transistors are connected at their respective gates.

5. The sense amplifier circuit according to claim 2, wherein said first and second transistors have channels of different sizes with respect to each other.

6. The sense amplifier circuit according to claim 1, wherein said sense node means includes an output amplifying inverter.

7. The sense amplifier circuit according to claim 1, wherein said sense node means includes a buffer circuit for reducing the capacitance seen by said sense node means.

8. The sense amplifier circuit according to claim 7, wherein said buffer circuit includes first and second transistor branches separately driven by said sense node means.

9. The sense amplifier circuit according to claim 8, wherein said first and second transistor branches are connected to a current source.

10. The sense amplifier circuit according to claim 8, wherein said first and second transistor branches comprise exclusively nMOS transistors.

11. The sense amplifier circuit according to claim 1, further comprising clamping means for reducing the voltage swing at said sense node means.

12. The sense amplifier circuit according to claim 11, wherein said clamping means includes a current mirror arrangement for providing a pull down current to the sense node after completion of a low to high transition.

13. A method for providing a sense indication of the memory state of a selected semiconductor memory cell to a sense node connected to a first current mirror circuit for supplying electric current from a reference cell to a sense node, the sense node further being connected to a pass transistor for separating it from the selected memory cell, the pass transistor being connected at its other side to the memory cell, the method comprising the steps of:

(a) connecting a second current mirror circuit to the side of the pass transistor which is on the side of the selected memory cell, and (b) connecting the other side of the second current mirror circuit to modify the current provided to the first current mirror circuit from the reference cell, thereby providing a lubricating current to the first current mirror means, and effectively providing current to the pass transistor to ensure that it does not shut down in the absence of current flow from a core memory cell.

* * * * *